United States Patent [19]

Tseng et al.

[11] Patent Number: 5,571,734
[45] Date of Patent: Nov. 5, 1996

[54] METHOD FOR FORMING A FLUORINATED NITROGEN CONTAINING DIELECTRIC

[75] Inventors: Hsing-Huang Tseng; Philip J. Tobin, both of Austin, Tex.

[73] Assignee: Motorola, Inc., Schaumburg, Ill.

[21] Appl. No.: 316,175

[22] Filed: Oct. 3, 1994

[51] Int. Cl.$^6$ .................. H01L 21/225; H01L 21/3115
[52] U.S. Cl. .................. 437/40; 437/242; 437/983; 437/240
[58] Field of Search .................. 437/40 GS, 41 GS, 437/242, 983, 240

[56] References Cited

U.S. PATENT DOCUMENTS 5,258,333  11/1993  Shappir et al. .
5,264,396  11/1993  Thakur et al. .
5,382,533   1/1995  Ahmad et al. .

OTHER PUBLICATIONS

"Improvement in SiO2 Gate Dielectrics with Fluorine Incorporation", Wright et al.
"Improvements in Rapid Thermal Oxide/Re-Oxidized Nitrided Oxide (ONO) Films Using NF3", Cable et al, Mat. Res. Soc. Symp. Proc. vol. 224, 1991.
"Very Lightly Nitrided Oxide Gate Mosfets For Deep-Sub--Micron CMOS Devices", Momose et al, IEEE 1991.
"Improvement of the SiO2/Si Interface of Metal-Oxide-Semiconductor Devices Using Gate Dielectrics Formed by NF3-Aided Oxidation and N20 Post-Anealing", Huang, J.Appl.Phys. 75(5), 1 Mar. '94.

*Primary Examiner*—George Fourson
*Attorney, Agent, or Firm*—Minh-Hien N. Clark

[57] ABSTRACT

This disclosure reveals a manufacturable and controllable method to fabricate a dielectric which increases the device current drive. A nitrogen-containing ambient is used to oxidize a surface of a substrate (10) to form a nitrogen-containing dielectric (12). Then a fluorine-containing specie (F) is introduced, preferably through implanting, into a gate electrode (20) overlying the nitrogen-containing dielectric. The fluorine is then driven into the underlying nitrogen-containing dielectric. A fluorinated nitrogen-containing region (14') is expected to form at the interface between dielectric (12') and substrate (10). The interaction between fluorine and nitrogen increases the peak transconductance as well as the transconductance at a high electric field for the dielectric. Therefore, the overall current drive is increased by this approach.

19 Claims, 1 Drawing Sheet

METHOD FOR FORMING A FLUORINATED NITROGEN CONTAINING DIELECTRIC

CROSS-REFERENCE TO A RELATED APPLICATION

Related material is disclosed in a pending application Ser. No. 08/258,360 by Hsing Tseng et al., entitled "A Method for Forming a Semiconductor Dielectric" filed on Jun. 9, 1994 which is a continuation of application Ser. No. 07/975,959 entitled "A Semiconductor Dielectric and Method of Formation" filed on Apr. 30, 1992 now abandoned, both assigned to the assignee hereof.

FIELD OF THE INVENTION

The present invention relates generally to semiconductor technology, and more particularly, to a method for forming a semiconductor dielectric.

BACKGROUND OF THE INVENTION

Dielectric materials are frequently used in the formation of integrated circuit devices. Dielectric materials are used to form gate oxides for metal oxide semiconductor field effect transistors (MOSFETs), capacitor dielectrics, inter-polysilicon dielectrics, inter-metal dielectrics, final passivation layers, sacrificial layers, masking layers, and like structures. In most cases, the most critical oxide in an integrated circuit device is the gate oxide.

There are two conventional and widely used methods of forming a gate oxide. Both methods of forming the gate oxide require exposure of a silicon material to an oxidant-containing ambient and elevation of an ambient temperature. A wet silicon dioxide is formed over the silicon material when using steam, and a dry silicon dioxide material is formed when using oxygen. Wet and dry oxides are used frequently to form gate oxides. Silicon dioxide materials have several known disadvantages, such as boron penetration between a gate and a channel region, hot carrier injection problems, and a defect density and micropores which cause reduced breakdown voltages and reduced transistor lifetime.

Alternatively, another method of forming a gate oxide uses either nitrogen-containing or flourine-containing ambient in conjunction with the oxygen-containing ambient during the oxidation step to form a gate oxide having either nitrogen or fluorine therein to improve the quality of the gate oxide. However, a nitrided gate oxide lowers the peak transconductance (Gm) at a low electric field while increasing the transconductance at a high electric field. A higher Gm translates to a faster device speed which is more desirable.

A paper by James Cable et al. entitled "Improvements in Rapid Thermal Oxide/Re-Oxidized Nitrided Oxide (ONO) Films using $NF_3$" in the Materials Research Society Symposium Proceedings Vol. 224 postulated the combined effects of nitrogen and fluorine for improving the interface hardness between Si and $SiO_2$ to guard against hot electron and radiation damage. The process involved a substrate preclean step in $NF_3$ to introduce fluorine into the substrate, followed by a later exposure to $NH_3$ during the oxidation process to introduce nitrogen into the substrate. Cable's study indicated that low net charge trapping might be achievable given the right processing sequence. However, Cable's method was admittedly difficult to control and therefore, not suitable for a manufacturing environment.

Thus, a need exists for a controllable process to form a gate oxide having both nitrogen and fluorine therein to take advantage of the benefits that each provides.

DETAILED DESCRIPTION OF A PREFERRED EMBODIMENT

Figure 1:
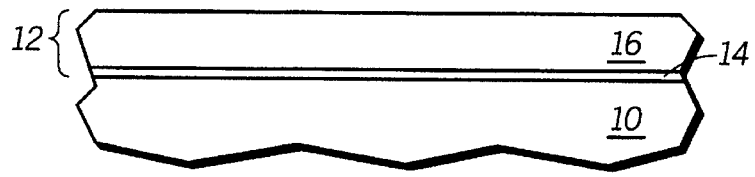
FIGS. 1–4 illustrate, in cross-section, process steps for forming a dielectric having improved performance in accordance with an embodiment of the invention.

The present invention provides a controllable method for forming a gate dielectric containing both nitrogen and fluorine. A surface portion of a semiconductor substrate is first oxidized in a nitrogen-containing oxidant ambient to form a nitrogen-containing dielectric. Then a gate electrode is formed overlying the nitrogen-containing dielectric. Next, fluorine is introduced, preferably through implanting, into the gate electrode to form a fluorinated gate electrode. An annealing step then drives the fluorine into the nitrogen-containing dielectric to form a fluorinated nitrogen-containing dielectric.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. Additionally, as many of the same or substantially similar elements are illustrated through the various embodiments of the invention as illustrated in the figures, like reference numerals are used to describe the same or substantially similar elements.

FIGS. 1–4 illustrate, in cross-section, process steps for forming a dielectric having improved performance in accordance with an embodiment of the invention. In FIG. 1 a substrate 10 having a top surface portion is provided. Typical substrate materials include but are not limited to silicon, gallium arsenide, silicon on sapphire, epitaxial formations, germanium, germanium silicon, polycrystalline silicon, amorphous silicon, and/or like semiconductor substrate materials. Furthermore, the substrate may be a gate dielectric for a MOSFET, an interpolysilicon dielectric for a non-volatile memory cell, or a tunnel dielectric for a non-volatile memory cell. Additionally, the substrate 10 may be a floating gate material for a non-volatile memory cell, such as FETMOS, or a like material.

As illustrated in FIG. 1, a nitrogen-containing dielectric layer 12 is formed overlying the substrate 10. A preferred thickness range for the dielectric layer 12 is approximately 50–300 angstroms (Å). This dielectric layer 12 may be formed by oxidizing the top surface portion of the substrate 10. The oxidation is performed with a nitrogen-containing oxidant ambient, preferably $O_2$ mixed with or followed by nitrous oxide ($NO_2$), nitric oxide (NO), nitrogen dioxide ($NO_2$), or ammonia ($NH_3$). Alternatively, these oxidants may be mixed with steam for the oxidation process. Moreover, these oxidants are typically used in conjunction with other diluents or carrier gases such as argon (Ar), nitrogen ($N_2$), helium (He), or any noble gases, with varying concentrations depending upon the specific diluent. Alternatively, it is possible to form the nitrogen-containing dielectric layer 12 by first oxidizing the top surface portion of the substrate 10 with oxygen ($O_2$) or steam ($H_2O$) to form a thermal oxide layer. Then an annealing step is performed with a nitrogen-containing ambient, such as nitrous oxide, nitric oxide, nitrogen dioxide, and ammonia to introduce nitrogen into the dielectric layer. In either method of forming the nitrogen-containing dielectric 12, it is expected that the nitrogen in this dielectric 12 is mostly concentrated at an interfacial region 14 between the dielectric 12 and the substrate 10. The bulk portion 16 of the dielectric layer 12 is a thermal oxide layer, preferably either a wet or dry silicon dioxide ($SiO_2$) material. The presence of nitrogen in this interfacial region acts to increase the transconductance of the semiconductor device (not shown) at high gate voltages.

Figure 2:
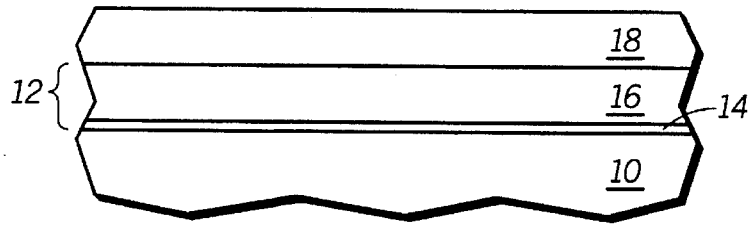

In FIG. 2, a gate electrode 18 is formed overlying the nitrogen-containing dielectric layer 12. The gate electrode 18 is a polysilicon gate is preferably formed by low pressure chemical vapor deposition (LPCVD). Other deposition processes, such as standard CVD or plasma enhanced chemical vapor deposition (PECVD) may also be used. All of these foregoing deposition methods are well known in the art. An experimentally determined working temperature for the formation of the gate electrode 18 is 620° C. using LPCVD. A typical thickness range for this gate electrode 18 is approximately 1000–3000 Å, although no specific thickness is required.

Figure 3:
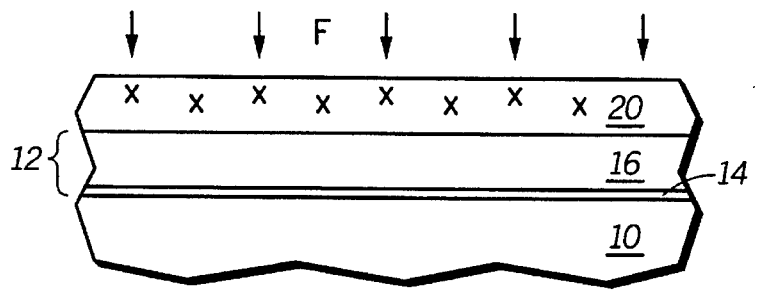

FIG. 3 illustrates a next step in this method of the invention where fluorine (F) is implanted into the gate electrode to form a fluorinated gate electrode 20. Implantation of fluorine is a controllable process making it suitable for a manufacturing environment where the introduction of controlled amounts of fluorine is desired. The "x" in FIG. 3 is intended to depict the expected location of the fluorine ions within the gate electrode as a result of implantation. The implanting is preferably performed with pure fluorine ions with a dose ranging from $1\times10^{14}$–$7\times10^{15}$, and energy ranging from 30–60 KeV. However, it is also possible to practice the present invention by implanting a fluorine-containing species which preferably does not contain a silicon dopant, such as boron, arsenic, or phosphorus. For example, it is possible to use $NF_3$ or $CF_3$ as implant species. It is important in practicing this invention to introduce nitrogen into the dielectric layer first before fluorine is introduced. The reason for this particular required sequence is that the fluorine-silicon bond is stronger than that of the nitrogen-silicon bond. Therefore, if fluorine were introduced first, then it becomes much more difficult to find available silicon to bond to nitrogen because the nitrogen cannot break the existing fluorine-silicon bonds. Thus, the sequence in the methods of the present invention provides a much more predictable and controllable process than the prior art as taught by Cable.

Figure 4:
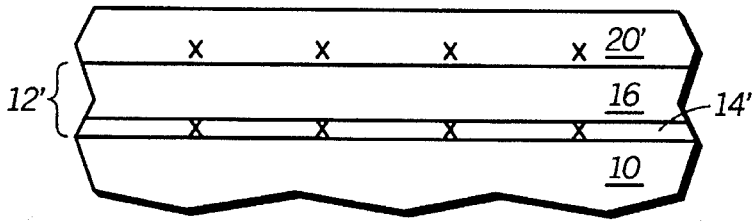

In FIG. 4, an annealing step is carried out to drive a majority of the fluorine ions in the fluorinated gate electrode into the underlying nitrogen-containing dielectric layer. The annealing is performed at a temperature substantially in a range of 600° to 1000° C., with a preferred range of 750° to 950° C. The lower annealing temperature range, from 600° to 750° C., may be possible with a thin gate electrode thickness and is also dependent on the implant energy used during implantation. The fluorine diffuses from the gate electrode into the nitrogen-containing dielectric to form a fluorinated nitrogen-containing dielectric 12'. It is expected that the fluorine ions will concentrate at the interfacial region to form a fluorinated nitrogen-containing interfacial region 14'. Furthermore, it is likely that fluorine will also concentrate at the interface between the annealed gate electrode 20' and the bulk portion 16 of the dielectric layer 12'.

The presence of fluorine increases the peak of the transconductance at a low gate voltage thereby counteracting the loss of peak transconductance due to the presence of nitrogen. Thus, by having both nitrogen and fluorine in the interfacial region, a net gain in device speed, at both low and high gate voltages, can be achieved. By performing the steps illustrated in FIGS. 1–4, it is possible to controllably form a fluorinated nitrogen-containing dielectric overlying a substrate. This fluorine-containing and nitrogen-containing dielectric is very useful as a gate dielectric because it combines the benefits of both fluorine and nitrogen into a single layer.

It may also be advantageous to add trace amounts of chlorine during the oxidation step into the nitrogen-containing dielectric. Thereafter, what is formed is a chlorinated nitrogen-containing dielectric. Then fluorine is implanted into the gate electrode to form a fluorinated chlorinated nitrogen-containing dielectric. The presence of chlorine enables the removal of sodium and other metals from the device. Thus, this method provides a method to introduce chlorine into the device.

Figure 5:
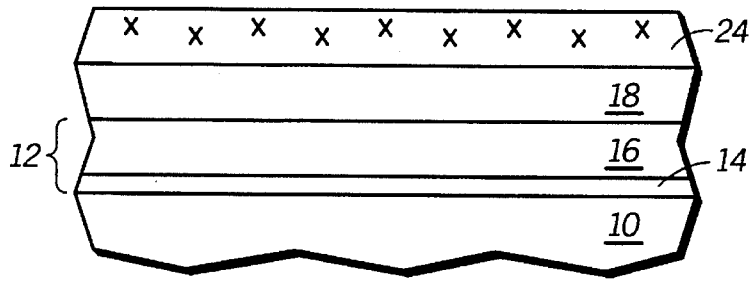
FIGS. 5–6 illustrate, in cross-section, alternative process steps for forming a dielectric having improved performance in accordance with a second embodiment of the invention.
Figure 6:
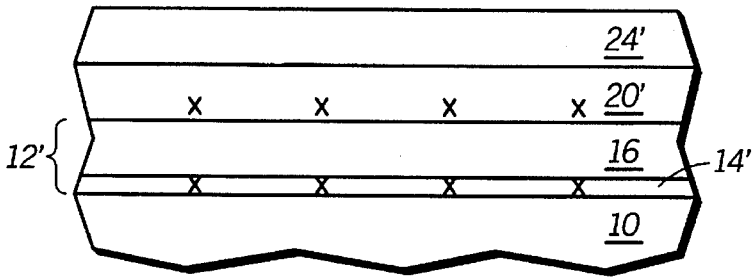

FIGS. 5–6 illustrate, in cross-section, alternative process steps for forming a dielectric having improved performance in accordance with another embodiment of the invention. In FIG. 5, a fluorine-containing dielectric 24 is formed overlying the gate electrode 18 which has been formed in a previous step substantially similar to FIG. 2. The fluorine-containing dielectric 24 can be formed with various methods. In a first method, the fluorine-containing dielectric 24 is grown by oxidizing a top surface portion of the gate electrode 18 with oxygen ($O_2$) and $NF_3$ or a fluorine-containing gas. This step forms a fluorinated thermal oxide.

Then in FIG. 6, an annealing step is performed to drive the fluorine in the top dielectric layer into the underlying nitrogen-containing dielectric to form the fluorinated nitrogen-containing dielectric 12'. The annealing temperature should be substantially in the range of 600° to 1000° C., with a preferred range of 750° to 950° C. Again, it is expected that the fluorine will concentrate in the interfacial region 14'. Also, some fluorine is expected to concentrate at the interface between the gate electrode 20' and the bulk thermal oxide layer 16 of the fluorinated nitrogen-containing dielectric 12' as well as the fluorine-containing dielectric 24'.

A second method of forming the fluorine containing dielectric 24 involves oxidizing the top surface of the gate electrode with $O_2$ to form an oxide layer. Then fluorine, preferably pure fluorine ions, can be implanted into this top oxide layer. However, it is also possible to implant other fluorine-containing species which do not contain a silicon dopant, such as boron, arsenic, and phosphorus. Annealing may then be performed to drive the fluorine into the underlying nitrogen-containing dielectric to form the fluorinated nitrogen-containing dielectric.

A third method of forming the fluorine containing dielectric 24 also involves oxidizing the top surface of the gate electrode with $O_2$ to form an oxide layer. It is then annealed in a fluorine-containing ambient, such as $NF_3$, so as to introduce fluorine into the dielectric. This annealing step should also drive the fluorine through the underlying gate electrode 20' into the underlying nitrogen-containing dielectric layer to form the fluorinated nitrogen-containing dielectric of the present invention.

As can be seen from the foregoing methods, it is critical that nitrogen be introduced into the gate dielectric before chlorine. The reason is that the fluorine-silicon bond is stronger than that of the nitrogen-silicon bond. Therefore, if fluorine were introduced first, then it becomes much more difficult to find available silicon to bond to nitrogen because the nitrogen cannot break the existing fluorine-silicon bonds. Thus, the sequence in the methods of the present invention provides a much more controllable process than the prior art.

The foregoing description and illustrations contained herein demonstrate many of the advantages associated with the present invention. In particular, it has been revealed that an increase of device peak transconductance is made possible by introducing fluorine into a gate dielectric. Moreover, the introduction of nitrogen into the same gate dielectric increases the transconductance at high electric fields. Hence, a combination of both fluorine and nitrogen into the same gate dielectric increases the overall current drive to improve device speed. The present invention enables manufacturable and controllable processes to be used to successfully incorporate both fluorine and nitrogen into the gate dielectric, which was not achievable by the prior art. Yet another advantage is that the present invention also allows for the incorporation of chlorine into the gate dielectric to remove sodium and other metals to further improve device reliability and performance.

Thus it is apparent that there has been provided, in accordance with the invention, a method for forming a dielectric having both fluorine and nitrogen therein for improved performance that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the addition of chlorine into the gate dielectric region may be possible with any of the above methods. In addition, the invention is not limited to a gate dielectric, as the methods are equally applicable for forming an interpoly dielectric for non-volatile memory applications or for forming stacked gate dielectrics. Therefore, it is intended that this invention encompasses all such variations and modifications falling within the scope of the appended claims.

We claim:

1. A method for making a dielectric comprising the steps of:

providing a substrate having a surface portion;

oxidizing the surface portion of the substrate using a nitrogen-containing oxidant to form a nitrogen-containing dielectric;

forming a gate electrode overlying the nitrogen-containing dielectric;

implanting fluorine into the gate electrode to form a fluorinated gate electrode; and annealing the fluorinated gate electrode to drive the fluorine into the nitrogen-containing dielectric to form a fluorinated nitrogen-containing dielectric.

2. The method of claim 1, wherein the step of oxidizing the surface portion is performed with the nitrogen-containing oxidant being selected from a group consisting of: nitrous oxide ($N_2O$), nitric oxide (NO), nitrogen dioxide ($NO_2$), and ammonia ($NH_3$).

3. The method of claim 1, wherein the step of providing the substrate comprises providing a material selected from a group consisting of single-crystalline silicon, polycrystalline silicon, interpolysilicon dielectric, and tunnel dielectric.

4. The method of claim 1, wherein the step of implanting fluorine comprises implanting pure fluorine ions.

5. The method of claim 1, wherein the step of annealing the fluorinated gate electrode is performed at a temperature substantially in a range of 600° to 1000° C.

6. The method of claim 1, further comprising the step of introducing chlorine into the nitrogen-containing dielectric.

7. A method for making a dielectric comprising the steps of:

providing a substrate having a surface portion;

oxidizing the surface portion of the substrate to form an oxide layer;

annealing the oxide layer with a nitrogen-containing ambient to form a nitrogen-containing dielectric;

forming a gate electrode overlying the nitrogen-containing dielectric;

implanting fluorine into the gate electrode to form a fluorinated gate electrode; and annealing the fluorinated gate electrode to drive the fluorine into the nitrogen-containing dielectric to form a fluorinated nitrogen-containing dielectric.

8. The method of claim 7, wherein the step of annealing the oxide layer is performed in an ambient containing a gas selected from a group consisting of: nitrous oxide ($N_2O$), nitric oxide (NO), nitrogen dioxide ($NO_2$), and ammonia ($NH_3$).

9. The method of claim 7, wherein the step of providing the substrate comprises providing a material selected from a group consisting of single-crystalline silicon, polycrystalline silicon, interpolysilicon dielectric, and tunnel dielectric.

10. The method of claim 7, wherein the step of implanting fluorine comprises implanting pure fluorine ions.

11. The method of claim 7, wherein the step of annealing the fluorinated gate electrode is performed at a temperature substantially in a range of 600° to 1000° C.

12. The method of claim 7, further comprising the step of introducing chlorine into the nitrogen-containing dielectric.

13. A method for making a dielectric comprising the steps of:

providing a silicon substrate having a surface portion;

forming a nitrogen-containing dielectric on the surface portion of the silicon substrate;

forming a gate electrode overlying the nitrogen-containing dielectric; and growing a fluorinated dielectric, which contains fluorine, overlying the gate electrode, wherein the fluorine in the fluorinated dielectric is driven, by heating, through the gate electrode into the nitrogen-containing dielectric to form a fluorinated nitrogen-containing dielectric.

14. The method of claim 13, wherein the step of growing the fluorinated dielectric is performed by oxidizing a top surface portion of the gate electrode with $O_2$ and a fluorine-containing ambient, to form a fluorinated oxide.

15. The method of claim 14, wherein heating of the fluorinated dielectric is further characterized as annealing the fluorinated oxide in a temperature range of 600° to 1000° C. to drive the fluorine into the nitrogen-containing dielectric to form the fluorinated nitrogen-containing dielectric.

16. The method of claim 13, wherein the step of growing the fluorinated dielectric comprises the steps of:

oxidizing a top surface of the gate electrode with $O_2$ to form an oxide layer; and annealing the oxide layer in a fluorine-containing ambient to introduce fluorine into the oxide layer and to drive the fluorine into the nitrogen-containing dielectric.

17. The method of claim 13, wherein the step of growing the fluorinated dielectric comprises the steps of:

oxidizing a top surface of the gate electrode with $O_2$ to form an oxide layer; and implanting fluorine ions into the oxide layer.

18. The method of claim 17, wherein heating of the fluorinated dielectric is further characterized as annealing the fluorinated dielectric in a temperature range of 600° to 1000° C. to drive the fluorine into the nitrogen-containing dielectric to form the fluorinated nitrogen-containing dielectric.

19. The method of claim 13, further comprising the step of introducing a chlorine-containing specie into the surface portion of the silicon substrate during the step of forming the nitrogen-containing dielectric.

* * * * *